United States Patent [19]
Perner

[11] Patent Number: 5,818,261
[45] Date of Patent: Oct. 6, 1998

[54] PSEUDO DIFFERENTIAL BUS DRIVER/RECEIVER FOR FIELD PROGRAMMABLE DEVICES

[75] Inventor: Frederick A. Perner, Palo Alto, Calif.

[73] Assignee: Hewlett Packard Company, Palo Alto, Calif.

[21] Appl. No.: 694,891

[22] Filed: Aug. 8, 1996

[51] Int. Cl.[6] .................... H03K 19/0185; H03K 19/177
[52] U.S. Cl. .................... 326/86; 326/39; 326/45; 326/81
[58] Field of Search .................... 326/83, 86, 39, 326/41, 21, 44–45, 68, 80–81, 90, 49–50; 327/333, 53, 56

[56] References Cited

U.S. PATENT DOCUMENTS

| 5,311,083 | 5/1994 | Wanlass | 326/81 |
| 5,541,529 | 7/1996 | Mashiko et al. | 326/39 |
| 5,614,844 | 3/1997 | Sasaki et al. | 326/50 |
| 5,644,255 | 7/1997 | Taylor | 326/86 |

Primary Examiner—Jon Santamauro
Attorney, Agent, or Firm—Timothy Rex Croll

[57] ABSTRACT

A bus mechanism mitigates programmable device performance and power consumption issues by utilizing a small swing transmitter at the source end of an interconnect network and a high gain differential amplifier at the receiver end of the interconnect network. The signal is generated as a small swing voltage differential compared to a reference voltage and the reference voltage is set at a magnitude close to the negative power supply signal (near ground or GND). Because the performance of NMOS cross point switches with signals close to GND is very good, virtually no signal swing is lost in these NMOS cross point switches. The small swing signal voltages also significantly reduce the power dissipated when transmitting data. Transmitter pre-charge, differential amplifier equalization and a PMOS differential amplifier further enhance performance and reduce power consumption. The bus mechanism is well suited to the general requirements of field programmable devices of providing flexible fan-in, flexible fan-out, and unrestricted interconnect through NMOS cross point switches and large interconnect load capacitances.

20 Claims, 5 Drawing Sheets

PSEUDO DIFFERENTIAL BUS DRIVER/ RECEIVER FOR FIELD PROGRAMMABLE DEVICES

BACKGROUND OF THE INVENTION

1. Field of the Invention

The present invention relates to field programmable devices and, more particularly, to bus circuitry within field programmable devices.

2. Description of the Related Art

Application specific integrated circuits ("ASIC") provide their users the ability to manufacture products having a proprietary design without having to begin design at the device level. Many different ASIC technologies are available, including gate array, standard cell, full custom design and field programmable logic devices. The gate array, standard cell and full custom technologies offer high performance and flexibility, although at the expense of a long development cycle and a high non-recurring engineering cost.

Programmable logic devices, which include programmable logic array devices ("PLD"), field programmable logic array devices ("FPLA") and field programmable gate arrays ("FPGA"), are useful in a variety of applications such as glue logic and simple integrated circuit designs. Their utility has been limited in general due to the relatively low number of available usable gates, poor flexibility in implementing the required logic functions, low speed of operation and high power consumption.

A FPGA typically contains an array of simple logic gates and/or programmable look-up tables ("LUT"). The programmable elements in a programmable array are constructed of active devices such as diodes or transistors interconnected with fusible links, ultraviolet erasable floating gate devices, electrically erasable floating gate devices, or static memory cells coupled to transmission gates. Generally such devices are resistive and high in parasitic capacitance, and consume a relatively large silicon area. Moreover, the speed decreases with increasing array size, due to the increasingly parasitic capacitance of the array. Hence, for a given technology, the size of the array is limited by practical limitations.

High power dissipation and low performance are two problems that limit the usefulness of field programmable devices. One reason power dissipation is high in field programmable devices is because long interconnect wires typically have large capacitances associated with them and interconnect networks typically use several interconnect wires to route signals that transverse several blocks of circuits. Power dissipation is high in the interconnect networks because large capacitances must be charged to, and then discharged from, voltages that approach the full VDD supply voltage.

Moreover, performance of field programmable devices is typically poor because NMOS (N channel Metal-Oxide Semiconductor) cross point switches are used to connect these long interconnect wires. Physical layout efficiency dictates the use of NMOS cross point switches, however, NMOS cross point switches lose a portion of the signal when driving a signal high towards the power supply level (VDD). Because typical field programmable devices use simple static CMOS (Complementary-symmetry Metal-Oxide Semiconductor) circuits whose performance is a direct function of the magnitude of the signal swing, if a portion of the signal is lost through NMOS cross point switches, the performance degrades proportionally.

Therefore, it can be seen that high power dissipation and low performance of current technology field programmable devices limits the use of these devices in many applications.

Thus, there is an unresolved need for a mechanism to reduce power consumption and increase performance of programmable devices that employ NMOS cross point switches in an interconnect network.

SUMMARY OF THE INVENTION

The invention is a bus method and apparatus that provides a mechanism to mitigate programmable device performance and power consumption issues by utilizing a small swing transmitter at the source end of an interconnect network and a high gain differential amplifier at the receiver end of the interconnect network. A signal is generated as a small swing voltage differential compared to a reference voltage and the reference voltage is set at a magnitude close to the negative power supply signal (near ground or GND).

Because the performance of NMOS cross point switches with signals close to GND is very good, virtually no signal swing is lost in these NMOS cross point switches. The small swing signal voltages also significantly reduce the power dissipated when transmitting data. Transmitter pre-charge, differential amplifier equalization and a PMOS differential amplifier further enhance performance and reduce power consumption.

The bus mechanism is well suited to the general requirements of field programmable devices of providing flexible fan-in, flexible fan-out, and unrestricted interconnect through NMOS cross point switches and large interconnect load capacitances.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

Embodiments of the invention are discussed below with reference to FIGS. 1–5. Those skilled in the art will readily appreciate that the detailed description given herein with respect to these figures is for explanatory purposes, however, because the invention extends beyond these limited embodiments.

Figure 1:
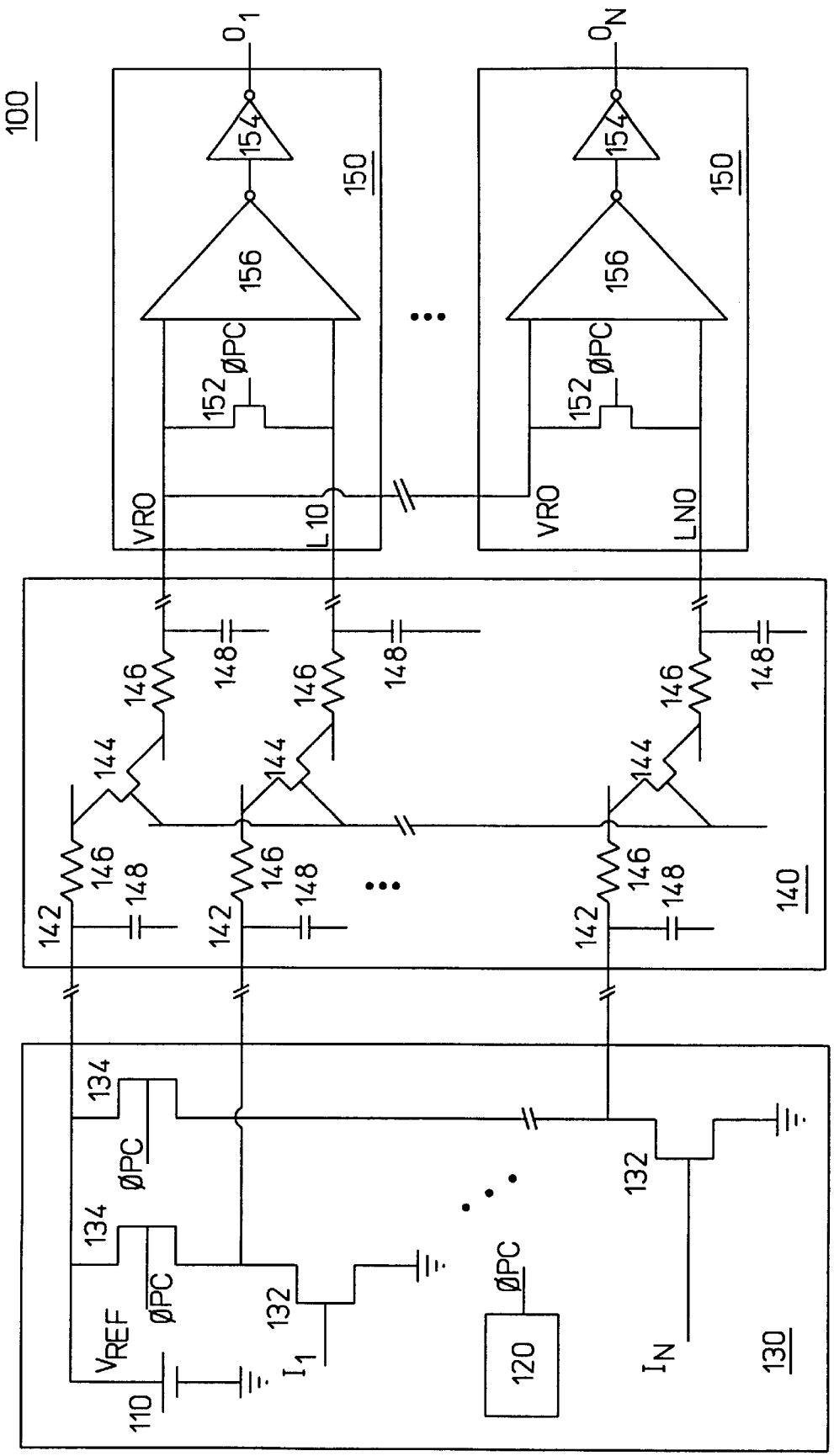
FIG. 1 a circuit schematic of an embodiment of a field programmable device bus mechanism constructed according to the present invention.

FIG. 1 shows a circuit schematic of an embodiment of a field programmable device bus mechanism constructed according to the present invention. In FIG. 1, programmable logic device bus mechanism 100 is comprised of transmitter 130, interconnect network 140 and receivers 150. Bus mechanism 100 is N-wide, meaning that an integral number, N, of signals can be sent at any given time from transmitter 130 to receivers 150 through interconnect network 140.

Transmitter 130 has signal circuits 1-N wherein each of the N signal circuits includes a pull down device 132 and a precharge device 134. For the embodiment depicted in FIG. 1, transmitter 130 further includes clocked logic circuit 120 and reference voltage source 110. For alternate embodiments however, rather than being part of transmitter 110 as shown in FIG. 1, clocked logic circuit 120 and reference voltage source 130 are located elsewhere within bus mechanism 100.

Interconnect network 140 includes lines 142. Included among lines 142 are a reference voltage line, and N signal lines, i.e., one signal line for each of the N signals. Each line 142 has at least one cross point switch 144 as well as associated resistive loads 146 and capacitive loads 148.

There are N receivers 150, i.e., one receiver 150 for each of the N signals. In FIG. 1, each receiver 150 includes an equalization device 152, a differential amplifier 156 and a level shifter/buffer driver device 154. For alternate embodiments however, rather than being part of receivers 150 as shown in FIG. 1, the level shifter/buffer driver devices 154 are located elsewhere within bus mechanism 100.

Programmable logic device bus mechanism 100 is a set of circuitry designed to improve the power consumption and performance of a field programmable device by reducing the signal level of networks connecting programmable logic circuits through NMOS cross point switches. Transmitter circuit 130 has a reference voltage source 110, and one or more signal circuits containing a pre-charge device 134 and a pull down device 132. A reference signal is routed along with the one or more signal lines through the interconnect network 140 lines 142 (i.e., long wires and cross point switches 144) to a receiver circuit 150 for each signal line. Each receiver circuit 150 has an equalization circuit 152, a differential amplifier 156, and a level shifter/buffer driver 154. Bus mechanism 100 is scalable in that it can be used for one data signal line (and one reference signal line) or for many signal lines that share a single reference signal line.

The bus mechanism 100 embodiment illustrated in FIG. 1 uses clocked logic. A pre-charge clock is synchronized across the physical circuit so that precharge of the transmitter 130 is synchronized with the equalization of the receivers 150. Synchronization of the pre-charge circuits 134 and equalization circuits 152 permits more than one receiver 150 to be connected to the output of the transmitter 130. Therefore, a flexible fan-out that is desirable in field programmable devices can be implemented.

Flexible fan-in is achieved by implementing pull down devices 132 using NMOS transistors in the transmitter circuits 130. For an embodiment wherein pull down devices 132 are NMOS transistors, the transmitter circuit 130 remains a high impedance circuit until the NMOS pull down transistor is activated by an input data signal. Thus, many transmitters 130 may be connected to the interconnect network 140 as long as only one transmitter 150 is allowed to be active at a given time. The condition where more than one transmitter 130 is active at a given time is known as "bus contention". There are many bus contention protocols which are well known in the art and any of these bus contention protocols may be selected to avoid bus contention for a flexible fan-in.

Thus, it can be seen that bus mechanism 100 is well suited to the general requirements of field programmable devices of providing flexible fan-in, flexible fan-out, and unrestricted interconnect through NMOS cross point switches and large interconnect load capacitances.

Equalization device 152 of each receiver 150 initializes the inputs of its associated differential amplifier 156 during a pre-charge period set by signal ø PC so that the data signal (generally LiO; for i=1–N) and the remote reference voltage VrO) are equal at each differential amplifier 156. This is achieved when the data bus and a common reference voltage signal are provided by the transmitter circuit 130 and routed to the receiver circuit 150 via an interconnect network 140 that is similar for the data signal lines and the shared reference voltage line.

Routing the reference voltage from the transmitter 130 and sharing the reference voltage amongst the data signal lines to the receivers 150 makes bus mechanism 100 function as if it was a set of differential mode logic circuits. However, because only one reference is required for a group of signal lines in a bus, the circuit physical layout is similar to single ended (single wire) logic circuits. The name "pseudo differential bus driver" is derived from the sharing of a single reference signal amongst many differential amplifiers.

A level shifter/buffer amplifier 154 is included with each receiver circuit 150 to transform the limited voltage swing (i.e., VREF to GND) output voltage from the differential amplifier 156 to a full CMOS voltage swing (i.e., VDD to GND).

Small signal swing circuits are found typically in internal and external output bus structures of random access memories. For example, Rambus Inc. of Mountain View, Calif., has an external bus driver system that employs small swing signals for wide buses to enhance performance of memory systems.

In contrast to such memory bus systems, bus mechanism 100 described herein couples the properties of small signal swing buses with a lowering the voltage levels on the signal buses to take the best advantage of NMOS cross point switches 144. Thus, bus mechanism 100 overcomes limitations imposed by the use of cross point switches in field programmable devices to yield performance enhancements from small swing operation and power reduction.

Figure 2:
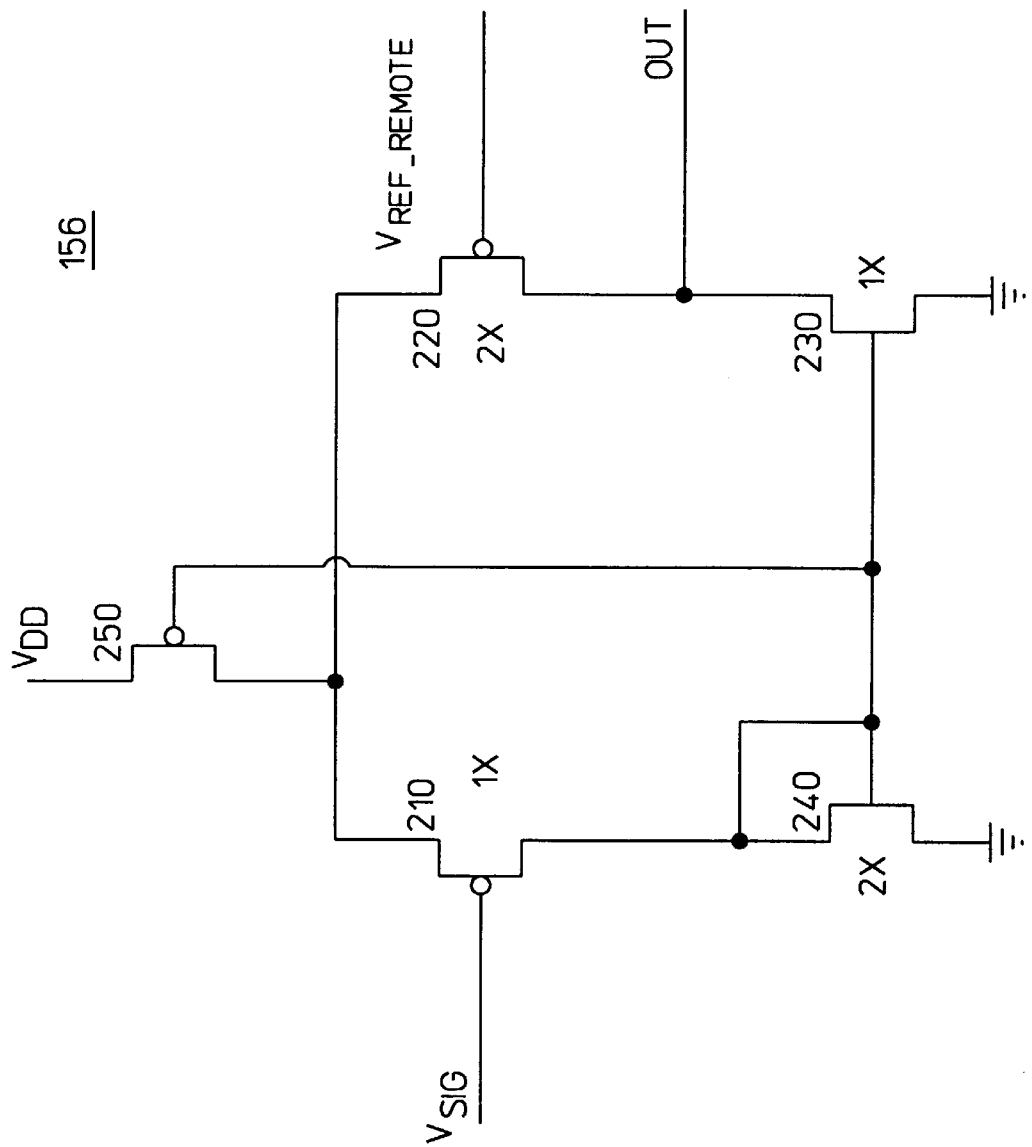
FIG. 2 is a circuit schematic of a differential amplifier suitable for use in the bus mechanism of FIG. 1.
Figure 3:
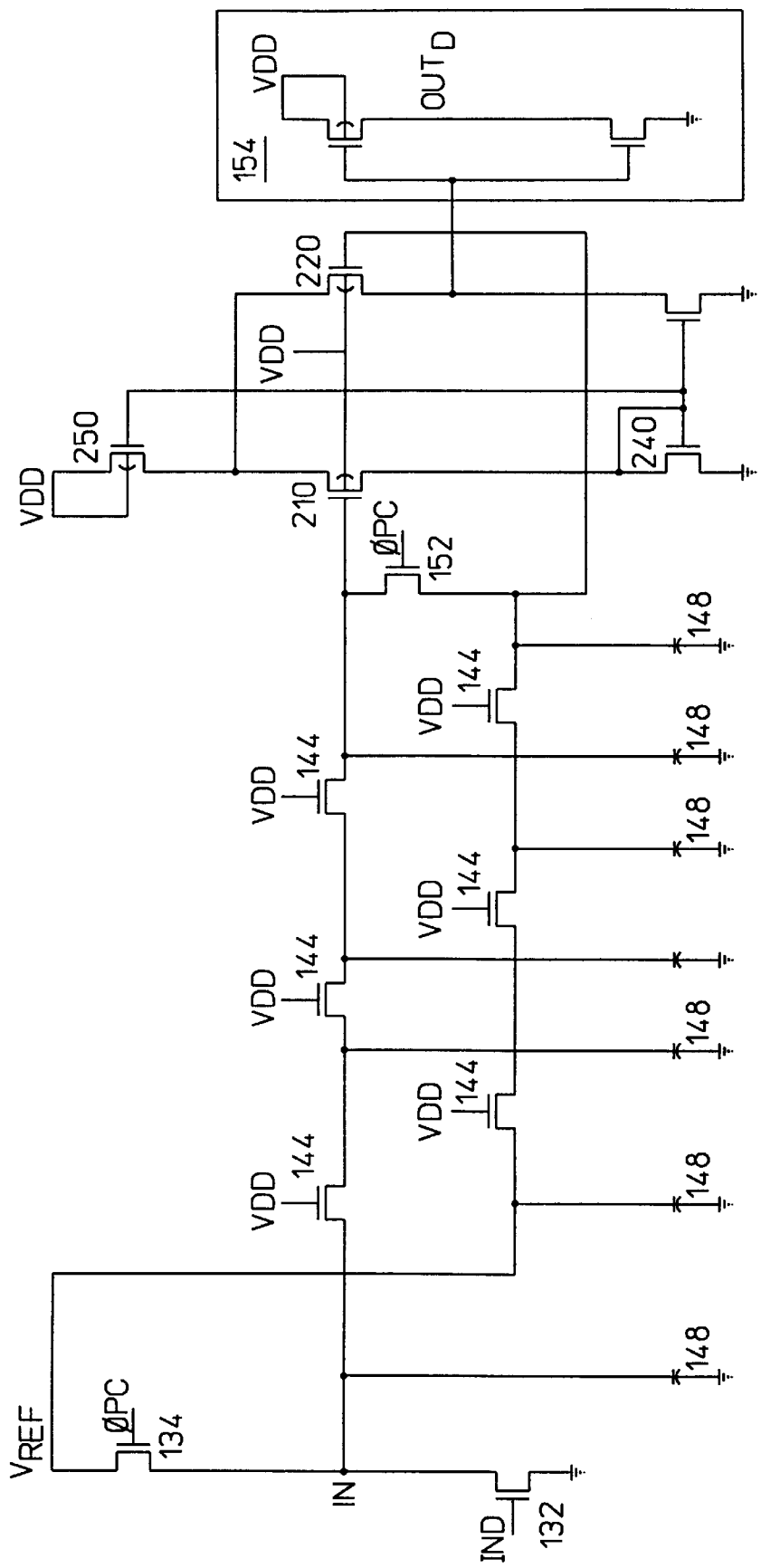
FIG. 3 is a circuit schematic of a single bit pseudo differential bus circuit.
Figure 4:
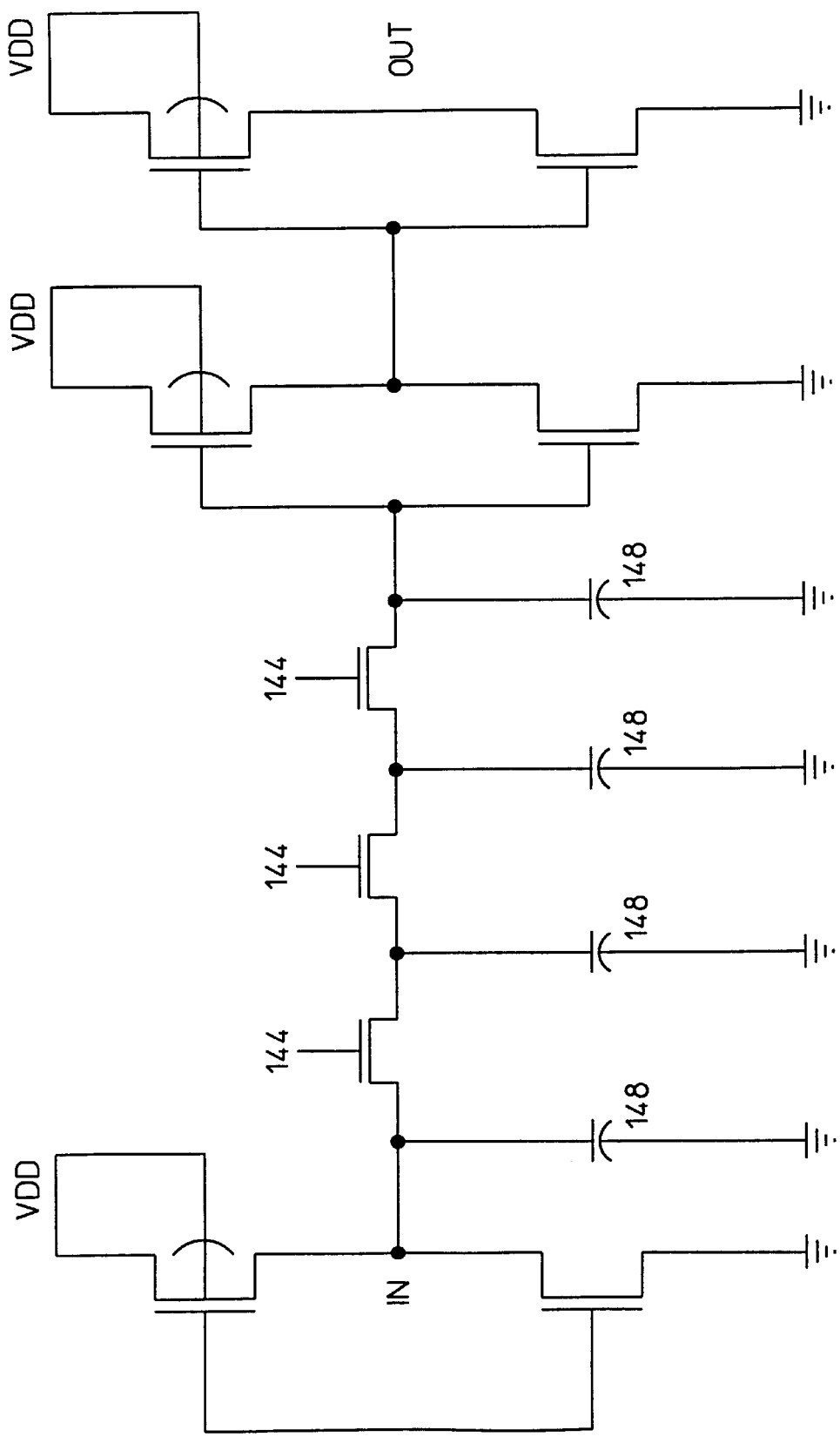
FIG. 4 is a circuit schematic of a conventional single bit CMOS bus circuit.

However, the use of cross point switches 144 in the bus require special consideration in the design of the differential amplifiers 156. This is because unlike differential mode sense amplifiers found in memory circuits, the reference signal of bus mechanism 100 does not act as a threshold voltage that generates valid output data when the signal line is a measure above or below the threshold. FIG. 2 is a circuit schematic of a differential amplifier 156 suitable for use in the bus mechanism of FIG. 1.

Differential amplifier 156 is "pre-charged" so that the absence of an active pull down on a data line will result in the differential amplifier 156 remaining at a level defined by the pre-charge period. Switching of the differential amplifier 156 is accomplished by setting a current threshold. When the input data lines have equal signal voltages, the current in the differential amplifier 156 flows primarily through one branch. However, when the input voltage on the signal side of the differential amplifier 156 falls below a designed threshold voltage, the current in the differential amplifier 156 switches to the other branch to thereby indicate a change in the logic value.

Referring to the FIG. 2 schematic diagram, PMOS (P channel Metal-Oxide Semiconductor) differential amplifier 156 is used because the input signal VSIG can be set as close to the GND potential as possible. In differential amplifier 156, the current threshold is set by sizing transistors 210, 220, 230 and 240. Relative sizes wherein transistors 210 and 230 have the same gain and transistors 220 and 240 have twice the gain of transistor 210 (and 230) were found to give good noise margins for one set of CMOS technology parameters. However, actual transistor sizing for differential amplifier 156 will depend on the performance required, the noise margins required, and the CMOS technology parameters for the given CMOS process.

Figure 5:
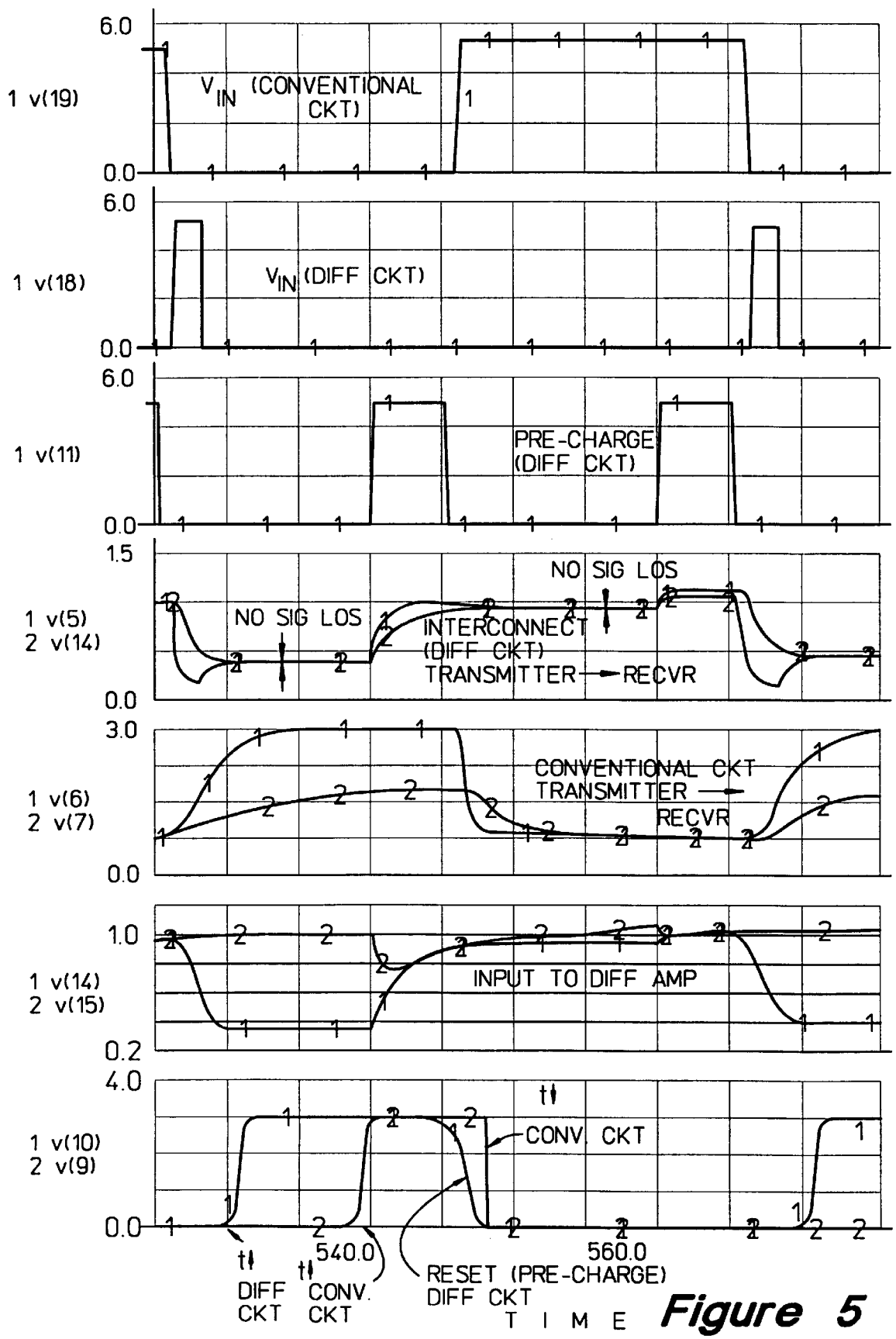
FIG. 5 is a timing diagram depicting results obtained from circuit simulations performed to compare the pseudo differential bus circuit of FIG. 3 to the conventional CMOS bus circuit of FIG. 4.

The functionality and performance of bus mechanism 100 has been verified by SPICE circuit simulations using circuit parameters that represent a field programmable device implemented using a current 0.5 $\mu$m CMOS process. FIG. 5 is a timing diagram depicting results obtained from single bit circuit simulations performed to compare the pseudo differential bus circuit of FIG. 3 to the conventional CMOS bus circuit of FIG. 4. Each circuit contains the same interconnect network with a total of 4 pf of load capacitance (equivalent to approximately 12 to 16 mm of interconnect metal) and three series cross point switches 144. For this simulation, performance of the transmitter, interconnect, cross points, and receiver shows that the conventional circuit lost about 50% of its signal attempting to switch from GND to VDD through the cross point switches 144 compared to virtually no loss through the pseudo differential circuit with a reference voltage set at 1.0 V (VDD=3.0 V).

In this simulation, the rise delay of the conventional circuit was 13.3 ns compared to 4.7 ns from the pseudo differential circuit. Fall delay of the conventional circuit was 2.27 ns but is not directly comparable to the pseudo differential circuit because the output was pre-charged low in the pseudo differential circuit. Rise delay performance was improved by a factor of 13.3/4.7 or a factor of 2.82.

In this simulation, the dynamic power dissipation in the interconnect for the pseudo differential circuit is 2.58 pj compared to the conventional circuit of 24.13 pj, representing an improvement of 24.13/2.58 or a factor of 9.35. The differential amplifier 156 used in this example draws a RMS current of 33 $\mu$a which adds to the total energy dissipation of the pseudo differential circuit to make a total dissipation of 6.5 pj for an improvement factor of 24.13/6.5=3.71.

For an alternate embodiment, circuitry is applied to the differential amplifier 156 to reduce the static energy dissipation by turning off the current source of the differential amplifier 156 during the pre-charge period. For one embodiment, it was found that gating the differential amplifier 156 current source with the pre-charge signal will cut the differential amplifier 156 dissipation to about 2.0 pj (i.e., the reduction is proportional to the pre-charge duty cycle) and thus reduce the pseudo differential circuit dissipation to 4.6 pj for an improvement factor in this example of 24.13/4.6= 5.25.

Thus, in contrast to the prior art field programmable device bus mechanisms, this invention routes a single reference signal line along with the data signal bus through the heavily loaded and complex interconnect to provide a suitable reference for differential amplifiers at the receivers. The reference voltage is set near the lowest power supply voltage rail (GND) to fully utilize the performance of NMOS cross point switches in the interconnect. Equalization devices placed at the input of each receiver differential amplifier circuit perform the function of equalizing the differential amplifier to the remote reference voltage during pre-charge. Clocked data buses with pre-charge and NMOS pull down allow multiple fan-in and fan-out circuits to share a common data bus.

The prior art contains fully differential signal lines where each signal is coupled either with a dedicated reference signal or a global/common reference signal. This invention addresses the non-ideal nature of interconnect as found on field programmable devices and utilizes a single data signal line to route a reference voltage from the transmitter to the receiver so that the signal degradation imposed on the data signal lines will also be imposed on the reference signal. This feature improves the common mode noise rejection of the bus driver/receiver circuit.

The NMOS cross point switches which enable the programmability of field programmable devices function best in the saturation mode when the gate-source voltage is set at VDD and the drain-source voltage is near the source potential (GND). This invention routes signals that must transverse one or more NMOS cross point switches using signals that have voltage potentials near GND by introducing a reference voltage that is near one Vt (NMOS threshold voltage). Because this low voltage is introduced, very little signal will be lost through the NMOS cross point switches. Furthermore, the low reference signal permits the use of differential logic for the data signal transmission. The differential logic, in turn, has low dynamic power dissipation and excellent signal propagation delay characteristics.

Equalization of differential mode signals is generally performed to recover or reset a signal line between data transmission clock periods. The equalization circuit may be placed at any point along the differential bus. By providing an equalization or pre-charge circuit at every transmitter circuit and receiver circuit of the interconnect network one can improve the equalization of signals along the network to allow for the use of physically smaller equalization transistors. This multitude of equalization circuits permits one or more transmitter circuits and one or more receiver circuits to share or tap into the same interconnect network.

Conventional field programmable devices use tri-state bus drivers to allow more than one circuit to drive a bus. These tri-state bus drivers are not required because the pre-charged buses and NMOS pull down logic are naturally high impedance drivers in the inactive or pre-charge state. It is only when a valid signal is applied to one NMOS pull down transistor that the bus transforms to a low impedance state, and then only while the NMOS transistor is active. Thus, the pre-charged NMOS logic eliminates the need for tri-state bus drivers and provides bus driver circuitry that is of higher performance than the conventional tri-state bus drivers.

This pseudo-differential bus driver/receiver circuit for field programmable devices is efficient to implement, has intrinsically higher performance than the existing field programmable art, is a low power solution for high performance system designs, and is a low noise bus driver/receiver system. SPICE simulations indicate that under some conditions, a five-fold improvement in power dissipation and a three-fold improvement in performance is possible over conventional field programmable device bus driver circuits.

The many features and advantages of the invention are apparent from the written description and thus it is intended by the appended claims to cover all such features and advantages of the invention. Further, because numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A bus mechanism for a programmable logic device, comprising:
   a small swing transmitter;
   a high gain differential amplifier; and
   a NMOS cross point switch interconnect network coupling the transmitter and the differential amplifier, wherein a signal is generated by the transmitter as a small swing voltage differential from a reference voltage and the signal is compared to the reference voltage by the differential amplifier.

2. A mechanism as recited in claim 1, further comprising:
   a level shifter/buffer driver for transforming a limited voltage swing output voltage signal from the differential amplifier to a full CMOS voltage swing.

3. A mechanism as recited in claim 1, wherein the small swing transmitter includes a reference voltage source for producing the reference voltage and the reference voltage is routed through the NMOS cross point switch interconnect network to the differential amplifier.

4. A mechanism as recited in claim 1, further including a clocked logic circuit coupled to the small swing transmitter and to the differential amplifier to synchronize precharge of the small swing transmitter with equalization of the differential amplifier.

5. A mechanism as recited in claim 1, wherein the differential amplifier employs PMOS circuitry.

6. A mechanism as recited in claim 1, further including a plurality of said small swing transmitters coupled to the NMOS cross point switch interconnect network, wherein only one of the plurality of transmitters is permitted to be active at a given time.

7. A mechanism as recited in claim 1, further including a plurality of differential amplifiers coupled to the NMOS cross point switch interconnect network.

8. A bus mechanism for a programmable logic device, comprising:
   a transmitter circuit including a signal circuit having a pre-charge device and a pull down device;
   a reference voltage source associated with the transmitter circuit;
   a receiver circuit having an equalization circuit and a differential amplifier; and
   interconnect lines including a reference voltage line and a signal line, each of the interconnect lines having a cross point switch, the signal line coupling the signal circuit to the receiver circuit, the reference voltage line coupling the reference voltage source to the receiver circuit.

9. A mechanism as recited in claim 8, wherein the receiver circuit further includes a level shifter/buffer driver for transforming a limited voltage swing output voltage signal from the differential amplifier to a full CMOS voltage swing.

10. A mechanism as recited in claim 8, wherein the cross point switch is a NMOS switch.

11. A mechanism as recited in claim 8, wherein the reference voltage source produces a voltage significantly closer to ground than to full source supply voltage.

12. A mechanism as recited in claim 8, further including a clocked logic circuit coupled to the transmitter circuit and to the receiver circuit to synchronize precharge of the transmitter circuit with equalization of the receiver circuit.

13. A mechanism as recited in claim 12, wherein absence of an active pull down on the signal line will cause the differential amplifier to remain at a pre-charge period defined level.

14. A mechanism as recited in claim 8, wherein the differential amplifier employs PMOS circuitry.

15. A mechanism as recited in claim 8, further including a plurality of the receiver circuits,
   wherein the transmitter circuit includes a plurality of the signal circuits;
   wherein the interconnection lines include a plurality of the signal lines; and
   wherein each of the signal lines couples one of the signal circuits to one of the receiver circuits.

16. A mechanism as recited in claim 15, further including a plurality of the transmitter circuits coupled to the signal lines, wherein only one of the transmitter circuits is permitted to be active at a given time.

17. A mechanism as recited in claim 8, wherein differential amplifier switching is accomplished by setting a current threshold.

18. A bus method for a programmable logic device, comprising the steps of:
   generating a signal as a small swing voltage differential from a reference voltage using a small swing transmitter;
   routing the signal and the reference voltage through a NMOS cross point switch interconnect network coupling the transmitter and a differential amplifier; and
   comparing the signal to the reference voltage using the differential amplifier.

19. A method as recited in claim 18, further comprising the step of:
   transforming a limited voltage swing output voltage signal from the differential amplifier to a full CMOS voltage swing using a level shifter/buffer driver.

20. A method as recited in claim 18, further including the step of:
   synchronizing precharge of the transmitter circuit with equalization of the differential amplifier using a clocked logic circuit.

* * * * *